(12) United States Patent
Greene et al.

(10) Patent No.: US 8,222,673 B2
(45) Date of Patent: Jul. 17, 2012

(54) SELF-ALIGNED EMBEDDED SIGE STRUCTURE AND METHOD OF MANUFACTURING THE SAME

(75) Inventors: Brian J. Greene, Wappingers Falls, NY (US); William K. Henson, Beacon, NY (US); Judson R. Holt, Wappingers Falls, NY (US); Michael D. Steigerwalt, Newburgh, NY (US); Kuldeep Amarnath, Beacon, NY (US); Rohit Pal, Hopewell Junction, NY (US); Johan W. Weijtmans, Hopewell Junction, NY (US)

(73) Assignees: International Business Machines Corporation, Armonk, NY (US); Globalfoundries Inc., Grand Cayman (KY)

( * ) Notice: Subject to any disclaimer, the term of this patent is extended or adjusted under 35 U.S.C. 154(b) by 168 days.

(21) Appl. No.: 12/795,683

(22) Filed: Jun. 8, 2010

(65) Prior Publication Data

US 2011/0298008 A1    Dec. 8, 2011

(51) Int. Cl.
*H01L 21/02* (2006.01)
(52) U.S. Cl. ............... 257/190; 257/192; 257/E21.409; 257/E29.255

(58) Field of Classification Search .................. 257/190, 257/192, E21.409, E29.255
See application file for complete search history.

(56) References Cited

U.S. PATENT DOCUMENTS

| 2006/0006854 A1* | 1/2006 | Oswald et al. ............... 323/282 |
| 2008/0057710 A1* | 3/2008 | Zhu et al. ..................... 438/682 |
| 2009/0302348 A1* | 12/2009 | Adam et al. .................. 257/190 |

* cited by examiner

*Primary Examiner* — Tan N Tran
(74) *Attorney, Agent, or Firm* — Scully, Scott, Murphy & Presser, P.C.; Yuanmin Cai (57) ABSTRACT

A low energy surface is formed by a high temperature anneal of the surfaces of trenches on each side of a gate stack. The material of the semiconductor layer reflows during the high temperature anneal such that the low energy surface is a crystallographic surface that is at a non-orthogonal angle with the surface normal of the semiconductor layer. A lattice mismatched semiconductor material is selectively grown on the semiconductor layer to fill the trenches, thereby forming embedded lattice mismatched semiconductor material portions in source and drain regions of a transistor. The embedded lattice mismatched semiconductor material portions can be in-situ doped without increasing punch-through. Alternately, a combination of intrinsic selective epitaxy and ion implantation can be employed to form deep source and drain regions.

11 Claims, 11 Drawing Sheets

SELF-ALIGNED EMBEDDED SIGE STRUCTURE AND METHOD OF MANUFACTURING THE SAME

FIELD OF THE INVENTION

The present invention relates to semiconductor structures, and more particularly to field effect transistor structures having embedded SiGe source/drain regions, and methods of manufacturing the same.

BACKGROUND OF THE INVENTION

Various techniques for enhancing semiconductor device performance through manipulation of carrier mobility have been investigated in the semiconductor industry. One of the key elements in this class of technology is the manipulation of stress in the channel of transistor devices by employing lattice mismatched materials in source/drain regions. Such lattice mismatched materials may be advantageously employed to generate stress on a semiconductor device, for example, by applying biaxial stress or uniaxial stress in a channel of a metal-oxide-semiconductor field effect transistor (MOSFET) to improve performance, for example, by increasing the on-current.

One method of providing stress to the channel of a semiconductor device is formation of embedded lattice mismatched semiconductor material portions such as SiGe portions embedded in source and drain regions of a field effect transistor. While embedded lattice mismatched semiconductor material portions are effective sources of mechanical stress on the channel of a field effect transistor, currently known methods of forming such embedded lattice mismatched semiconductor material portions employ filling of trenches having substantially vertical sidewalls in source and drain regions. Because the sidewalls of the trenches are substantially vertical, use of in-situ doped epitaxy to form embedded lattice mismatched semiconductor material portions is impractical due to the outdiffusion of dopants from the embedded regions into the body portion of the transistor and consequent punch-through between the source and the drain.

Further, the upper surfaces of embedded lattice mismatched semiconductor material portions in prior art structures are not self-aligned to the channel of the transistor. Consequently, minor variations in the location of the upper surfaces of the embedded lattice mismatched semiconductor material portions can result in variations in the overlap capacitance and the switching speed of the transistor.

SUMMARY OF THE INVENTION

A disposable spacer is formed around a gate electrode stack located on a top surface of a semiconductor layer. Trenches are formed by an anisotropic etch of the semiconductor layer employing the gate electrode stack and the disposable spacer as an etch mask. A low energy surface is formed by a high temperature anneal of the surfaces of each trench. The material of the semiconductor layer reflows during the high temperature anneal such that the low energy surface is a crystallographic surface that is at a non-orthogonal angle with the surface normal of the semiconductor layer. A lattice mismatched semiconductor material is selectively grown on the semiconductor layer to fill the trenches, thereby forming embedded lattice mismatched semiconductor material portions in source and drain regions of a transistor. The embedded lattice mismatched semiconductor material portions can be in-situ doped without increasing punch-through because of the non-orthogonal angle of the interface with the semiconductor layer. Alternately, a combination of intrinsic selective epitaxy and ion implantation can be employed to form deep source and drain regions. In this case, inner edges of deep source and drain regions can be formed closer to the gate than protruding portions of the deep source and drain regions, providing enhanced control of overlap capacitance between the gate and source and drain regions and improvement in uniformity in performance of the transistor.

According to an embodiment of the present invention, a semiconductor structure is provided, which includes: a gate stack located on a top surface of a semiconductor layer in a semiconductor substrate, the semiconductor layer including a first single-crystalline semiconductor material; and a pair of embedded semiconductor material portions embedded in the semiconductor layer and including a second single-crystalline semiconductor material that is epitaxially aligned with, and lattice mismatched with, the first single-crystalline semiconductor material. Each of the pair of embedded semiconductor material portions has a slanted planar interface between a first depth from a top surface of the semiconductor layer into the semiconductor substrate and a second depth from the top surface into the semiconductor substrate, the second depth being greater than the first depth.

According to another embodiment of the present invention, a method of forming a semiconductor structure is provided, which includes: forming a pair of trenches in a semiconductor layer of a semiconductor substrate, wherein each of the pair of trenches has a substantially vertical sidewall and a substantially horizontal bottom surface, and the semiconductor layer includes a first single-crystalline semiconductor material; reflowing the first single-crystalline semiconductor material in an anneal, whereby a slanted semiconductor surface having a surface orientation having a lower surface energy than the substantially vertical sidewall and the substantially horizontal bottom surface are formed in each of the pair of trenches; and forming a pair of embedded semiconductor material portions by depositing a second single-crystalline semiconductor material in each of the pair of trenches, wherein the second single crystalline semiconductor material is epitaxially aligned with, and lattice mismatched with, the first single-crystalline semiconductor material.

DETAILED DESCRIPTION OF THE INVENTION

As stated above, the present invention relates to field effect transistor structures having embedded SiGe source/drain regions, and methods of manufacturing the same, which are now described in detail with accompanying figures. It is noted that like and corresponding elements are referred to by like reference numerals.

Figure 1:
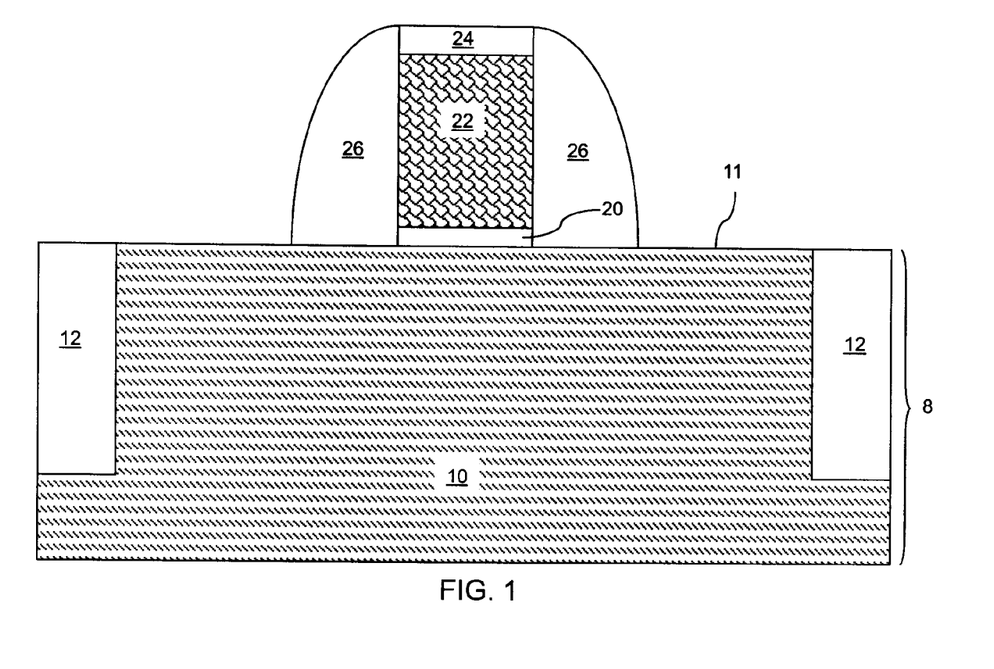
FIG. 1 is a vertical cross-sectional view of a first exemplary semiconductor structure after formation of a disposable spacer according to a first embodiment of the present invention.

Referring to FIG. 1, a first exemplary semiconductor structure according to a first embodiment of the present invention is shown, which comprises a semiconductor substrate 8 containing a semiconductor layer 10 and shallow trench isolation structures 12. The semiconductor layer 10 comprises a semiconductor material having a doping of a first conductivity type at a first dopant concentration. The semiconductor layer 10 may have a p-type doping or an n-type doping, or vice versa. Preferably, the semiconductor layer 10 is single crystalline, i.e., has the same crystallographic orientations throughout the volume of the semiconductor substrate 8.

The semiconductor layer 10 is composed of a semiconductor material, which may be selected from, but is not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. Typically, the semiconductor material is silicon. Preferably, the semiconductor layer 10 is a single crystalline silicon layer. In this case, the material of the semiconductor layer 10 is herein referred to as a first single-crystalline semiconductor material. The semiconductor layer 10 is typically lightly doped, i.e., have a dopant concentration from $1.0 \times 10^{15}/cm^3$ to $3.0 \times 10^{19}/cm^3$, and preferably from $1.0 \times 10^{15}/cm^3$ to $3.0 \times 10^{18}/cm^3$, although lesser and greater dopant concentrations are explicitly contemplated herein.

Typically, the surface orientation of the semiconductor layer 10, i.e., the crystallographic orientation of the surface normal of the top surface 11 of the semiconductor layer 10 is one of major crystallographic orientations. The crystallographic orientations of the semiconductor layer 10 are selected such that the surface orientation of the semiconductor layer 10 is not a surface having the minimum surface energy. A surface having minimum surface energy is a surface that provides the highest bonding strength among atoms on the surface. Dissociation of atoms from the surface having minimum surface energy requires more energy than dissociation of the same number of atoms from any other surfaces.

The semiconductor substrate 8 may be a bulk substrate, a semiconductor-on-insulator (SOI) substrate, or a hybrid substrate. The semiconductor substrate 8 may have a built-in stress in the semiconductor layer 10. While the present invention is described with a bulk substrate, implementation of the present invention on an SOI substrate or on a hybrid substrate is explicitly contemplated herein.

A gate stack is formed on the top surface 11 of the semiconductor layer 10. The gate stack includes, from bottom to top, a gate dielectric 20, a gate conductor 22, and a gate cap dielectric 24. The gate dielectric 20 may comprise a conventional silicon oxide based gate dielectric material or a high-k gate dielectric material known in the art. A high-k gate dielectric material is a dielectric material containing a metal oxide and having a dielectric constant greater than 3.0. The gate conductor 22 may comprise a doped semiconductor material such as doped polysilicon or a doped polycrystalline silicon alloy, or may comprise a metal gate material known in the art. The gate cap dielectric 24 includes a dielectric material such as silicon oxide or silicon oxynitride.

A disposable spacer 26 is formed on the sidewalls of the gate stack (20, 22, 24). The disposable spacer 26 includes a material that is different from the material of the semiconductor layer 10. Preferably, the disposable spacer 26 includes a material that is different from the material of the gate cap dielectric 24 and the shallow trench isolation structures 12. For example, the disposable spacer 26 can include silicon nitride. The lateral width of the disposable spacer 26 as measured at its base that contacts the top surface 11 of the semiconductor layer 10 may be adjusted to optimize the offset distance of embedded semiconductor material portions to be subsequently formed. The lateral width of the disposable spacer 26 can be from 10 nm to 120 nm, and typically from 30 nm to 90 nm, although lesser and greater thicknesses are contemplated herein also.

Figure 2:
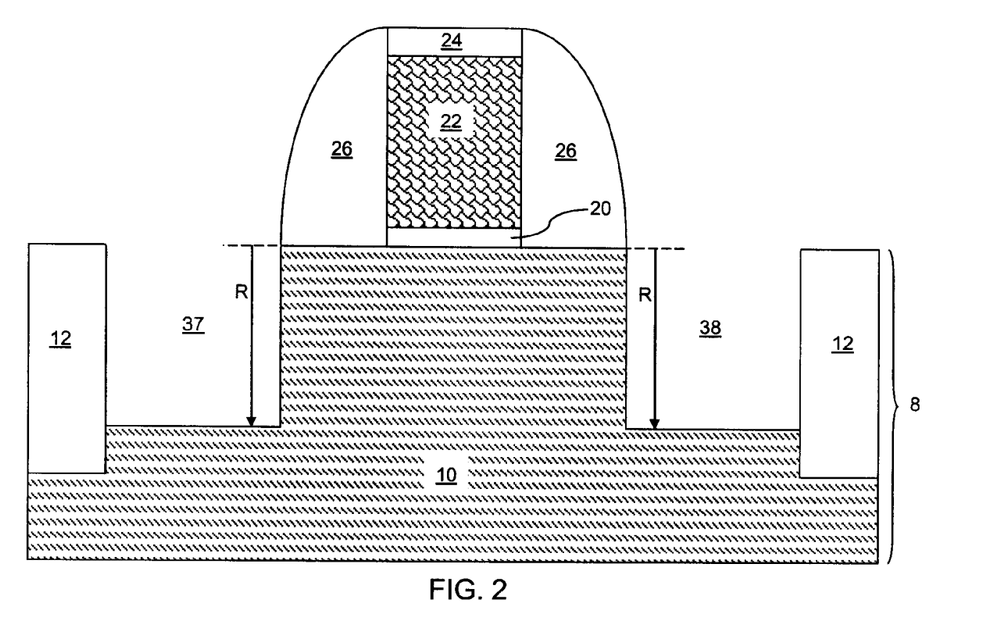
FIG. 2 is a vertical cross-sectional view of the first exemplary semiconductor structure after formation of a pair of trenches in a semiconductor layer according to the first embodiment of the present invention.

Referring to FIG. 2, a pair of trenches are formed in the semiconductor layer 10 by an anisotropic etch that etches exposed portions of the semiconductor layer 10 in the semiconductor substrate 8. During the anisotropic etch, the gate stack (20, 22, 24) and the disposable spacer 26 are employed as an etch mask. The pair of trenches includes a source-side trench 37 formed on one side of the gate stack (20, 22, 24) and a drain-side trench 38 formed on the opposite side of the gate stack (20, 22, 24). Each of the pair of trenches (27, 38) has a substantially vertical sidewall that extends vertically downward from an outer surface of the disposable spacer 26. Further, each of the pair of trenches (37, 38) can have a substantially horizontal bottom surface at a recess depth R, which is preferably less than the depth of the shallow trench isolation structures 12. Sidewall surfaces of the pair of trenches (37, 38) can include an outer surface of the shallow trench isolation structures 12. For example, the source-side trench 37 can have a sidewall that is vertically coincident with a bottom portion of a first sidewall of the disposable spacer 26 and another sidewall that is an outer surface of a shallow trench isolation structure 12. Likewise, the drain-side trench 38 can have a sidewall that is vertically coincident with a bottom portion of a second sidewall of the disposable spacer 26 and another sidewall that is an outer surface of another shallow trench isolation structure 12.

Figure 3:
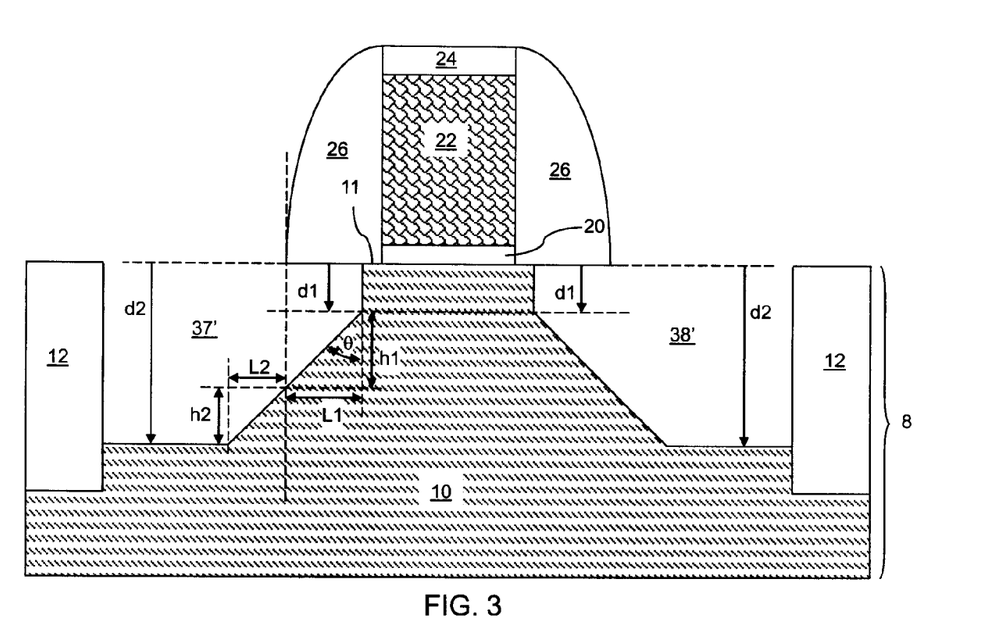
FIG. 3 is a vertical cross-sectional view of the first exemplary semiconductor structure after a reflow anneal according to the first embodiment of the present invention.

Referring to FIG. 3, a reflow anneal is performed to induce movement of semiconductor atoms of the semiconductor layer 10 at exposed surfaces of the source-side trench 37 and the drain-side trench. The first single-crystalline semiconductor material in the semiconductor layer 10 is reflowed to locally form slanted semiconductor surfaces having a surface orientation having a lower surface energy than the substantially vertical sidewalls and the substantially horizontal bottom surfaces of the pair of trenches (37, 38).

The reflow anneal is performed at an elevated temperature at which surface diffusion of semiconductor atoms become substantial enough to cause atomic movement and formation of the slanted semiconductor surfaces. For example, if the first single-crystalline semiconductor material of the semiconductor layer 10 is silicon, the reflow anneal can be performed at a temperature from 850° C. to 1,300° C. In one embodiment, the reflow anneal can be performed at a temperature from 880° C. to 1,200° C. In another embodiment, the reflow anneal can be performed at a temperature from 900° C. to 1,100° C. The reflow anneal temperatures for other semiconductor materials can be selected based on dependence of surface diffusion of the semiconductor materials on temperature.

In one embodiment, the reflow anneal is performed at a low pressure environment at a total pressure less than 1 mTorr. In another embodiment, the reflow anneal is performed at a reducing environment, i.e., in an ambient including hydrogen. The partial pressure of hydrogen can be from 1 mTorr to 760 Torr, and typically from 1 Torr to 80 Torr. The ambient can be 100% hydrogen, or can be a mixture of hydrogen with an inert gas such as He, Ne, and Ar. In yet another embodiment, the reflow anneal is performed in inert ambient including at least one inert gas.

Further, during a high temperature anneal at which surface diffusion of atoms is enabled, surfaces tend to "reflow," i.e., altered to change the physical shapes so that a surface having minimum surface energy is formed. For single crystalline silicon, the surface having minimum surface energy is (111) surface. Correspondingly, if the semiconductor layer 10 is a single crystalline silicon layer, the top surface 11 of the semiconductor layer 10 does not have a surface orientation of (111). In this case, the surface orientation of the top surface 11 of the semiconductor layer 10 can be (100) or (110).

The vertical cross-sectional profile of the pair of trenches (37, 38) changes during the reflow anneal. The trenches after reflow are herein referred to as "reflowed trenches." The pair of reflowed trenches include a source-side reflowed trench 37' and a drain-side reflowed trench 38'. Each of the source-side reflowed trench 37' and the drain-side reflowed trench 38' has a substantially vertical sidewall, a slanted planar surface, and a substantially horizontal bottom surface.

In each of the pair of reflowed trenches (37', 38'), the substantially vertical sidewall extends from the top surface of the semiconductor layer 10 contacting a bottom surface of the gate dielectric 20 to a first depth d1 into the semiconductor substrate 8. The slanted planar surface extends from the first depth d1 to a second depth d2 at which the substantially horizontal bottom surface is located. The angle θ between a surface normal of the top surface 11 of the semiconductor layer 10 and the slanted surfaces of each of the pair of reflowed trenches (37', 38') is a non-orthogonal, non-zero angle. If the surface orientation of top surface 11 is <100> and the surface orientation of the slanted planar surfaces is <111>, the angle θ is arccos (1/3). If the surface orientation of top surface 11 is <110> and the surface orientation of the slanted planar surfaces is <111>, the angle θ is arccos (2/3).

In each of the pair of reflowed trenches (37', 38'), the lateral distance between a substantially vertical sidewall and a vertical plane tangentially contacting the base of an overlying portion of the disposable spacer 26 is referred to as a first lateral distance L1. Likewise, the lateral distance between a proximal edge of a substantially planar bottom surface and the vertical plane tangentially contacting the base of the overlying portion of the disposable spacer 26 is referred to as a second lateral distance L2. The vertical distance between the bottom edge of the substantially vertical sidewall and an intersect of the vertical plane tangentially contacting the base of the overlying portion of the disposable spacer 26 with the slanted planar surface is referred to as a first vertical height h1 The vertical distance between the substantially planar bottom surface and the intersect of the vertical plane tangentially contacting the base of the overlying portion of the disposable spacer 26 with the slanted planar surface is herein referred to as a second vertical height h2.

The total lateral offset L between the substantially vertical sidewall and the proximal edge of the substantially planar bottom surface in each reflowed trench (37', 38') is given by: L=L1+L2. The total vertical offset h between the substantially vertical sidewall and the proximal edge of the substantially planar bottom surface in each reflowed trench (37', 38') is given by: h=h1+h2. The depth of the bottommost portion of the substantially vertical sidewalls from the top surface 11 is the first depth d1. The depth of the substantially planar bottom surfaces of the pair of reflowed trenches (37', 38') is herein referred to as a second depth d2, which can be the same as the recess depth R if the reflow anneal is performed in a non-reducing environment, and can be greater than the recess depth R if the reflow anneal is performed in a reducing environment.

Figure 4:
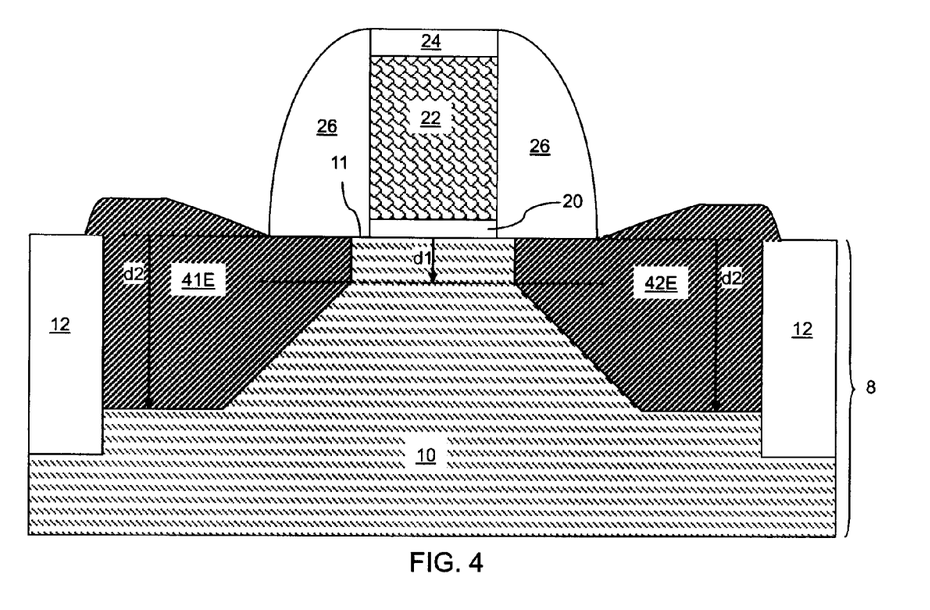
FIG. 4 is a vertical cross-sectional view of the first exemplary semiconductor structure after a selective epitaxy of an in-situ doped semiconductor material according to the first embodiment of the present invention.

Referring to FIG. 4, a selective epitaxy is performed to deposit an in-situ doped semiconductor material in the pair of reflowed trenches (37', 38'), thereby forming a pair of embedded doped semiconductor material portions. The pair of embedded doped semiconductor material portions includes a source-side embedded doped semiconductor material portion 41E and a drain-side embedded doped semiconductor material portion 42E. The in-situ doped semiconductor material has a doping of a second conductivity type, which is the opposite of the first conductivity type. For example, if the first conductivity type is p-type, the second conductivity type is n-type, and vice versa. The pair of embedded doped semiconductor material portions (41E, 42E) is typically heavily doped, i.e., have a dopant concentration from $1.0 \times 10^{19}/cm^3$ to $3.0 \times 10^{21}/cm^3$, and preferably from $1.0 \times 10^{20}/cm^3$ to $1.0 \times 10^{21}/cm^3$, although lesser and greater dopant concentrations can also be employed. A p-n junction coincides with each interface between the semiconductor layer 10 and the pair of embedded doped semiconductor material portions (41E, 42E).

The in-situ doped semiconductor material in each embedded doped semiconductor material portion (41E, 42E) is a single crystalline material if the semiconductor layer 10 is single-crystalline. In this case, the semiconductor material in the pair of embedded doped semiconductor material portions (41E, 42E) is referred to as a second single-crystalline semiconductor material. The second single crystalline semiconductor material is epitaxially aligned with, and lattice mismatched with, the first single-crystalline semiconductor material.

Each of the pair of embedded doped semiconductor material portions (41E, 42E) has a slanted planar interface between the first depth d1 from the top surface 11 of the semiconductor layer 10 into the semiconductor substrate 8 and the second depth d2 from the top surface 11 into the semiconductor substrate 8. The second depth d2 is greater than the first depth d1. The slanted planar interfaces between the first single-crystalline semiconductor material having a doping of the first conductivity type and the second single-crystalline semiconductor material having a doping of the second conductivity type are coincident with the slanted semiconductor surfaces of the pair of reflowed trenches (37', 38').

Each of the pair of embedded doped semiconductor material portions (41E, 42E) has a substantially vertical interface with the semiconductor layer 10 between the top surface 11 and the first depth d1, and a substantially horizontal interface with the semiconductor layer 10 at the second depth d2.

In one embodiment, the first single-crystalline semiconductor material is silicon, and the second single-crystalline semiconductor material is a silicon-germanium alloy. In this case, the second single-crystalline semiconductor material in the pair of embedded doped semiconductor material portions (41E, 42E) has a greater lattice constant than the first single-crystalline semiconductor material in the semiconductor layer 10. Consequently, uniaxial compressive stress is applied to the channel of the transistor, which is the portion of the semiconductor layer 10 located directly underneath the gate dielectric 20. The uniaxial compressive stress is applied in the direction connecting the source-side embedded doped semiconductor material portion 41E and the drain-side embedded doped semiconductor material portion 42E, i.e., in the horizontal direction in FIG. 4.

In another embodiment, the first single-crystalline semiconductor material is silicon, and the second single-crystalline semiconductor material is a silicon-carbon alloy. In this case, the second single-crystalline semiconductor material in the pair of embedded doped semiconductor material portions (41E, 42E) has a reduced lattice constant than the first single-crystalline semiconductor material in the semiconductor layer 10. Consequently, uniaxial tensile stress is applied to the channel of the transistor, which is the portion of the semiconductor layer 10 located directly underneath the gate dielectric 20. The uniaxial tensile stress is applied in the direction connecting the source-side embedded doped semiconductor material portion 41E and the drain-side embedded doped semiconductor material portion 42E, i.e., in the horizontal direction in FIG. 4.

Figure 5:
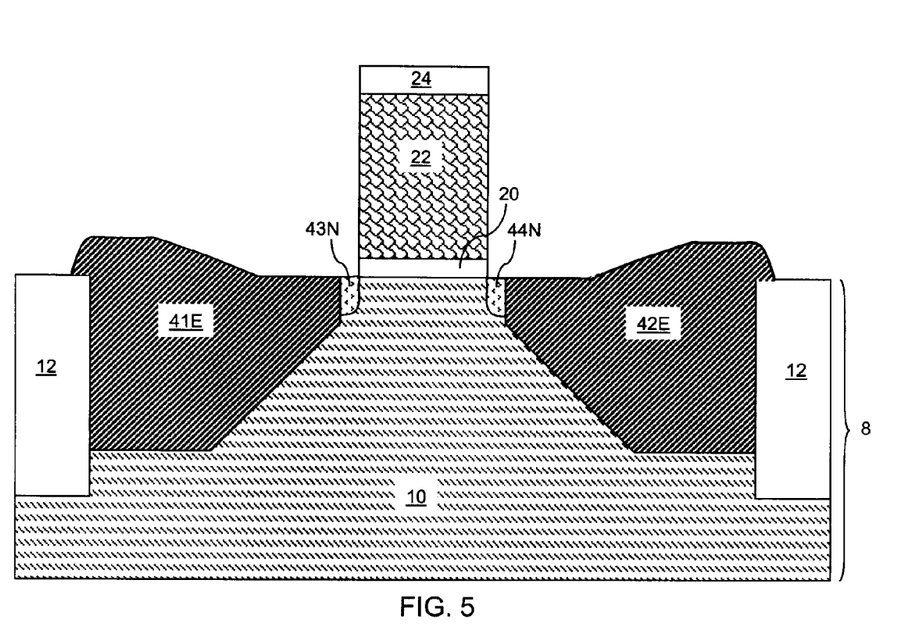
FIG. 5 is a vertical cross-sectional view of the first exemplary semiconductor structure after extension implantation according to the first embodiment of the present invention.

Referring to FIG. 5, the disposable spacer 26 is removed selective to the shallow trench isolation structures 12, the semiconductor layer 10, the pair of embedded doped semiconductor material portions (41E, 42E), the gate dielectric 20, the gate conductor 22, and the gate cap dielectric 24. Extension implantation is performed employing the gate stack (20, 22, 24) as an ion implantation mask to implant dopants of the second conductivity type into exposed portions of the pair of embedded doped semiconductor material portions (41E, 42E) and the semiconductor layer 10. The implanted dopants of the second conductivity type in the implanted portions of the pair of embedded doped semiconductor material portions (41E, 42E) increase the dopant concentration. The doping type remains as the second conductivity type in the implanted portions of the pair of embedded doped semiconductor material portions (41E, 42E) because dopants of the second conductivity type are added. The dose of the ion implantation is selected to change the doping of the implanted portions of the semiconductor layer 10 from the first conductivity type to the second conductivity type. Consequently, a source-side extension region 43N and a drain-side extension region 44N, each having a doping of the second conductivity type, are formed in the implanted portions of the semiconductor layer 10. The edges of the source-side and drain-side extension regions (43N, 44N) are aligned to the sidewalls of the gate stack (20, 22, 24).

The first exemplary semiconductor structure is a field effect transistor having a channel including a portion of the semiconductor layer 10 directly underneath the gate dielectric 20. The channel has a doping of the first conductivity type, and the entirety of each of the pair of embedded doped semiconductor material portions (41E, 42E) has a doping of the second conductivity type that is the opposite of the first conductivity type.

The source-side extension region 43N includes the first single-crystal semiconductor material and has a doping of the second conductivity type. The source-side extension region 43N laterally contacts the source-side embedded doped semiconductor material portion 41E. The drain-side extension region 44N includes the first single-crystal semiconductor material and having a doping of the second conductivity type. The drain-side extension region 44N laterally contacts the drain-side embedded doped semiconductor material portion 42E.

Figure 6:
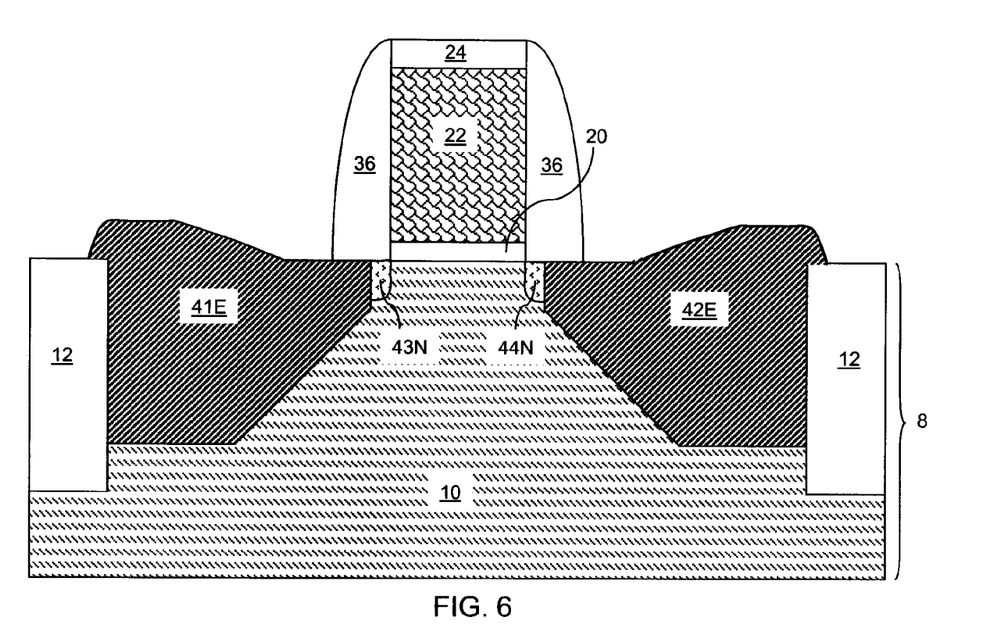
FIG. 6 is a vertical cross-sectional view of the first exemplary semiconductor structure after formation of a gate spacer according to the first embodiment of the present invention.

Referring to FIG. 6, a gate spacer 36 is deposited on the sidewalls of the gate stack (20, 22, 24). The gate spacer 36 includes a dielectric material such as silicon oxide, silicon nitride, or silicon oxynitride. Preferably, the lateral width of the gate spacer 36, as measured at the base of the gate spacer 36 that contacts the pair of embedded doped semiconductor material portions (41E, 42E) and the source-side and drain-side extension regions (43N, 44N), is less than the lateral width of the disposable spacer 26 at the processing step corresponding to FIG. 2. The gate spacer 36 can be formed by deposition of a conformal dielectric material layer and an anisotropic etch as known in the art.

Figure 7:
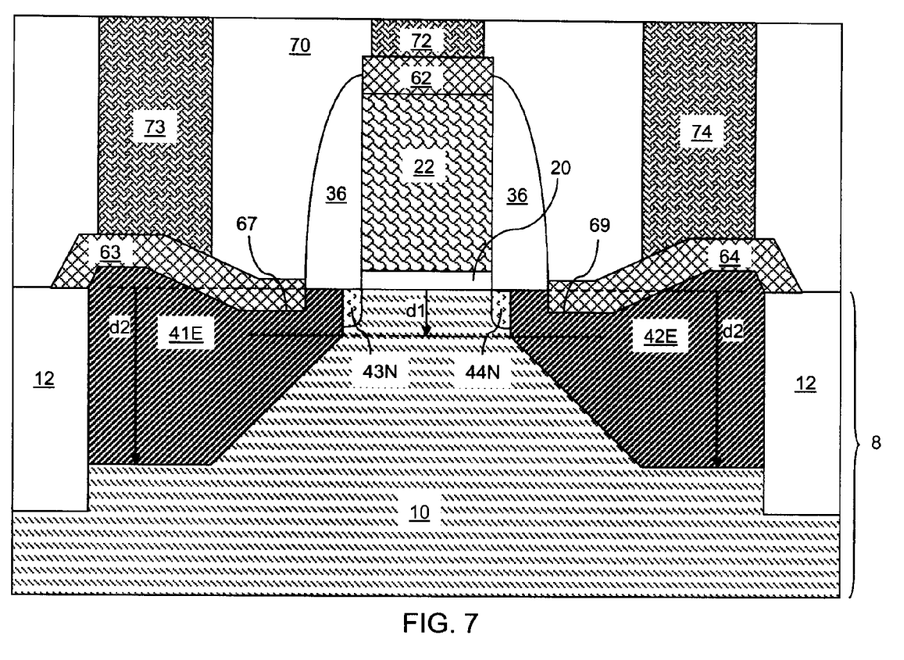
FIG. 7 is a vertical cross-sectional view of the first exemplary semiconductor structure after formation of metal-semiconductor alloy portions and contact structures according to the first embodiment of the present invention.

Referring to FIG. 7, the gate cap dielectric 24 can be removed selective to the gate conductor 22. Various metal-semiconductor alloy portions are formed, for example, by reacting a metal layer with exposed semiconductor material portions including exposed surfaces of the pair of embedded doped semiconductor material portions (41E, 42E) and optionally, the top surface of the gate conductor 22. The various metal semiconductor alloy portions can include a source-side metal-semiconductor alloy portion 63 that is located on the source-side embedded doped semiconductor material portion 41E and a drain-side metal-semiconductor alloy portion 64 that is located on the drain-side embedded doped semiconductor material portion 42E. A first interface 67 between a proximal portion of the source-side metal-semiconductor alloy portion 63 and the source-side embedded doped semiconductor material portion 41E is a first planar surface that is located between the top surface of the semiconductor layer 10 and the first depth d1. The proximal portion of the source-side metal-semiconductor alloy portion 63 is the sub-portion of the source-side metal-semiconductor alloy portion 63 that is located in proximity to the gate stack (20, 22). A second interface 69 between a proximal portion of the drain-side metal-semiconductor alloy portion 64 and the drain-side embedded doped semiconductor material portion 42E is a second planar surface that is located between the top surface of the semiconductor layer 10 and the first depth d1. The proximal portion of the drain-side metal-semiconductor alloy portion 64 is the sub-portion of the drain-side metal-semiconductor alloy portion 64 that is located in proximity to the gate stack (20, 22). A gate-side metal semiconductor alloy 62 can optionally be formed on the gate conductor 22.

A middle-of-line (MOL) dielectric layer 70 is subsequently deposited over the various metal semiconductor alloy portions (62, 63, 64). The MOL dielectric layer 70 includes a dielectric material such as doped silicate glass, undoped silicate glass, a low-k CVD material such as organosilicate glass, a spin-on low-k dielectric material, or a combination thereof. A "low-k" material refers to a material having a dielectric constant less than the dielectric constant of silicon oxide, i.e., 3.9. Various contact structures are formed by filling contact via holes in the MOL dielectric layer 70 and subsequently filling the contact via holes with a conductive material such as metal. The various contact structures can include, for example, a source-side contact via 73, a drain-side contact via 74, and a gate-side contact via 72.

The first exemplary semiconductor structure is a field effect transistor in which the source-side embedded doped semiconductor material portion 41E is the source of the transistor, and the drain-side embedded doped semiconductor material portion 42E is the drain of the transistor. The source-side extension region 43N is the source extension of the transistor, and the drain-side extension region 44N is the drain extension of the transistor. The first exemplary semiconductor structure provides the benefit of uniaxial stress in the channel while minimizing the punch-through between the source and the drain because of the slanted p-n junctions at the interface between the semiconductor layer 10 and the pair of embedded doped semiconductor material portions (41E, 42E).

Figure 8:
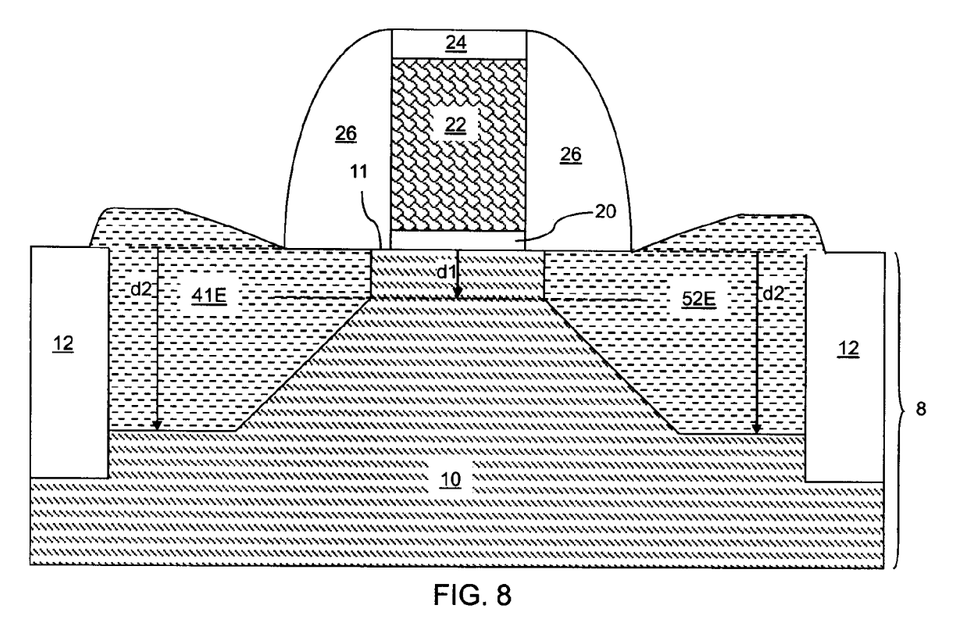
FIG. 8 is a vertical cross-sectional view of a second exemplary semiconductor structure after a selective epitaxy of an undoped semiconductor material according to a second embodiment of the present invention.

Referring to FIG. 8, a second exemplary semiconductor structure according to a second embodiment of the present invention is derived from the first exemplary semiconductor structure of FIG. 3 by performing a selective epitaxy of a second single-crystalline semiconductor material, which can be an undoped semiconductor material or a semiconductor material having a doping of the first conductivity type at a low dopant concentration. A pair of embedded semiconductor material portions is formed by depositing the second single-crystalline semiconductor material in each of the pair of reflowed trenches (37', 38'). The second single crystalline semiconductor material is epitaxially aligned with, and lattice mismatched with, the first single-crystalline semiconductor material of the semiconductor layer 10. The pair of embedded semiconductor material portions includes a source-side embedded semiconductor material portion 51E and a drain-side embedded semiconductor material portion 52E.

In each of the pair of embedded semiconductor material portions (51E, 52E), the second single-crystalline semiconductor material is epitaxially aligned with, and lattice mismatched with, the first single-crystalline semiconductor material of the semiconductor layer 10. Each of the pair of embedded semiconductor material portions (51E, 52E) has a slanted planar interface between a first depth d1 from the top surface 11 of the semiconductor layer 10 into the semiconductor substrate 8 and a second depth d2 from the top surface 11 into the semiconductor substrate 8. The second depth d2 is greater than the first depth d1. The slanted planar interfaces are coincident with the slanted semiconductor surfaces in FIG. 3.

Further, each of the pair of embedded semiconductor material portions (51E, 52E) has a substantially vertical interface with the semiconductor layer 10 between the top surface 11 and the first depth d1, and a substantially horizontal interface with the semiconductor layer 10 at the second depth d2.

In one embodiment, the first single-crystalline semiconductor material is silicon, and the second single-crystalline semiconductor material is a silicon-germanium alloy. In this case, the second single-crystalline semiconductor material in the pair of embedded semiconductor material portions (51E, 52E) has a greater lattice constant than the first single-crystalline semiconductor material in the semiconductor layer 10. Consequently, uniaxial compressive stress is applied to the channel of the transistor, which is the portion of the semiconductor layer 10 located directly underneath the gate dielectric 20. The uniaxial compressive stress is applied in the direction connecting the source-side embedded semiconductor material portion 51E and the drain-side embedded semiconductor material portion 52E, i.e., in the horizontal direction in FIG. 4.

In another embodiment, the first single-crystalline semiconductor material is silicon, and the second single-crystalline semiconductor material is a silicon-carbon alloy. In this case, the second single-crystalline semiconductor material in the pair of embedded semiconductor material portions (51E, 52E) has a reduced lattice constant than the first single-crystalline semiconductor material in the semiconductor layer 10. Consequently, uniaxial tensile stress is applied to the channel of the transistor, which is the portion of the semiconductor layer 10 located directly underneath the gate dielectric 20. The uniaxial tensile stress is applied in the direction connecting the source-side embedded semiconductor material portion 51E and the drain-side embedded semiconductor material portion 52E, i.e., in the horizontal direction in FIG. 4.

Figure 9:
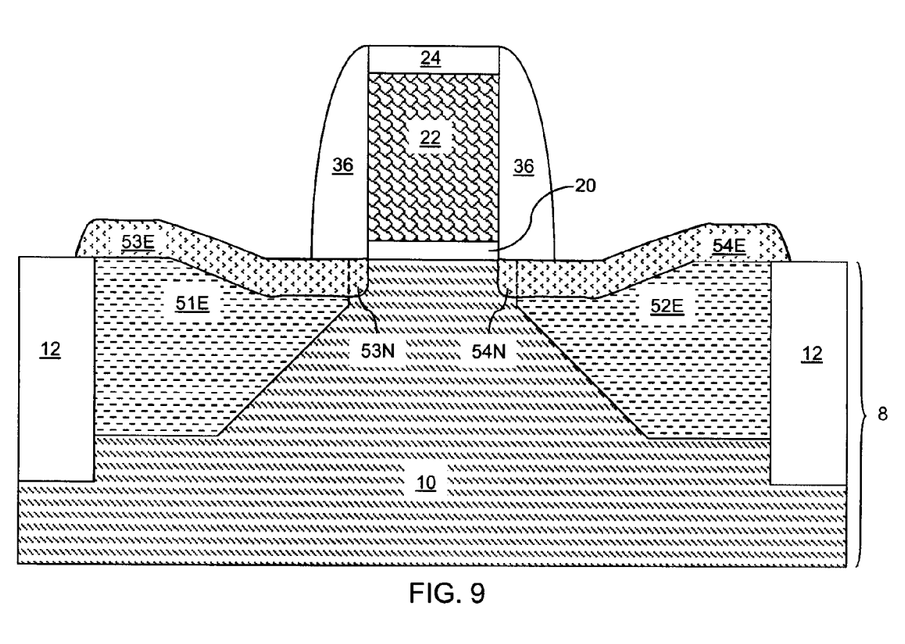
FIG. 9 is a vertical cross-sectional view of the second exemplary semiconductor structure after extension implantation and formation of a gate spacer according to the second embodiment of the present invention.

Referring to FIG. 9, the disposable spacer 26 is removed selective to the shallow trench isolation structures 12, the semiconductor layer 10, the pair of embedded semiconductor material portions (51E, 52E), the gate dielectric 20, the gate conductor 22, and the gate cap dielectric 24. Extension implantation is performed employing the gate stack (20, 22, 24) as an ion implantation mask to implant dopants of the second conductivity type into exposed portions of the pair of embedded semiconductor material portions (51E, 52E) and the semiconductor layer 10. An additional implantation mask such as a patterned photoresist (not shown) may be employed to block implantation of the dopants of the second conductivity type in areas in which implantation of the dopants is not desired.

The implanted portion of the semiconductor layer 10 on the source side, i.e., the side of the source-side embedded semiconductor material portion 51E, is doped with the implanted dopants of the second conductivity type to constitute a first source-side extension region portion 53N. The first source-side extension region portion 53N includes the first single-crystal semiconductor material and has a doping of the second conductivity type. The first source-side extension region portion 53N contacts one side of the channel, which is the portion of the semiconductor layer 10 that is located directly underneath the gate dielectric 20.

The implanted portion of the semiconductor layer 10 on the drain side, i.e., the side of the drain-side embedded semiconductor material portion 52E, is doped with the implanted dopants of the second conductivity type to constitute a first drain-side extension region portion 54N. The first drain-side extension region portion 54N includes the first single-crystal semiconductor material and has a doping of the second conductivity type. The first drain-side extension region portion 53N contacts the other side of the channel.

The implanted portion of the source-side embedded semiconductor material portion 51E is converted into a region having a doping of the second conductivity type, and is herein referred to as a second source-side extension region portion 53E. The second source-side extension region portion 53E includes the second single-crystal semiconductor material and has a doping of the second conductivity type. The second source-side extension region portion 53E contacts the remaining portion of the source-side embedded semiconductor material portion 51E.

The implanted portion of the drain-side embedded semiconductor material portion 52E is converted into a region having a doping of the second conductivity type, and is herein referred to as a second drain-side extension region portion 54E. The second drain-side extension region portion 54E includes the second single-crystal semiconductor material and has a doping of the second conductivity type. The second drain-side extension region portion 54E contacts the remaining portion of the drain-side embedded semiconductor material portion 52E.

The first source-side extension region portion 53N, the second source-side extension region portion 53E, the first drain-side extension region portion 54N, and the second drain-side extension region portion 54E has a doping of the second conductivity type at a dopant concentration from $1.0 \times 10^{19}/cm^3$ to $1.0 \times 10^{21}/cm^3$, and preferably from $1.0 \times 10^{20}/cm^3$ to $3.0 \times 10^{20}/cm^3$, although lesser and greater dopant concentrations can also be employed. At this point, the source-side embedded semiconductor material portion 51E and the drain-side embedded semiconductor material portion 52E can be undoped, or can have a low level of doping of the first conductivity type, i.e., at a dopant concentration less than $1.0 \times 10^{18}/cm^3$. The first source-side extension region portion 53N and the second source-side extension region portion 53E collectively constitute a source-side extension region, and the first drain-side extension region portion 54N and the second drain-side extension region portion 54E collectively constitute a drain-side extension region. The proximal edge of the source-side extension region (53N, 53E) and the proximal edge of drain-side extension region (54N, 54E) are aligned to sidewalls of the gate stack (20, 22, 24). Specifically, the proximal edge, i.e., the edge closer to the gate stack among the edges, of the first source-side extension region portion 53N is vertically coincident with a sidewall of the gate stack (20, 22, 24), and the proximal edge of the first drain-side extension region portion 54N is vertically coincident with another sidewall of the gate stack (20, 22, 24).

Subsequently, a gate spacer 36 is deposited on the sidewalls of the gate stack (20, 22, 24). The gate spacer 36 includes a dielectric material such as silicon oxide, silicon nitride, or silicon oxynitride. Preferably, the lateral width of the gate spacer 36, as measured at the base of the gate spacer 36 that contacts the source-side extension region (53N, 53E) or the drain-side extension region (54N, 54E), is less than the lateral width of the disposable spacer 26 at the processing step corresponding to FIG. 2. The gate spacer 36 can be formed by deposition of a conformal dielectric material layer and an anisotropic etch as known in the art.

Figure 10:
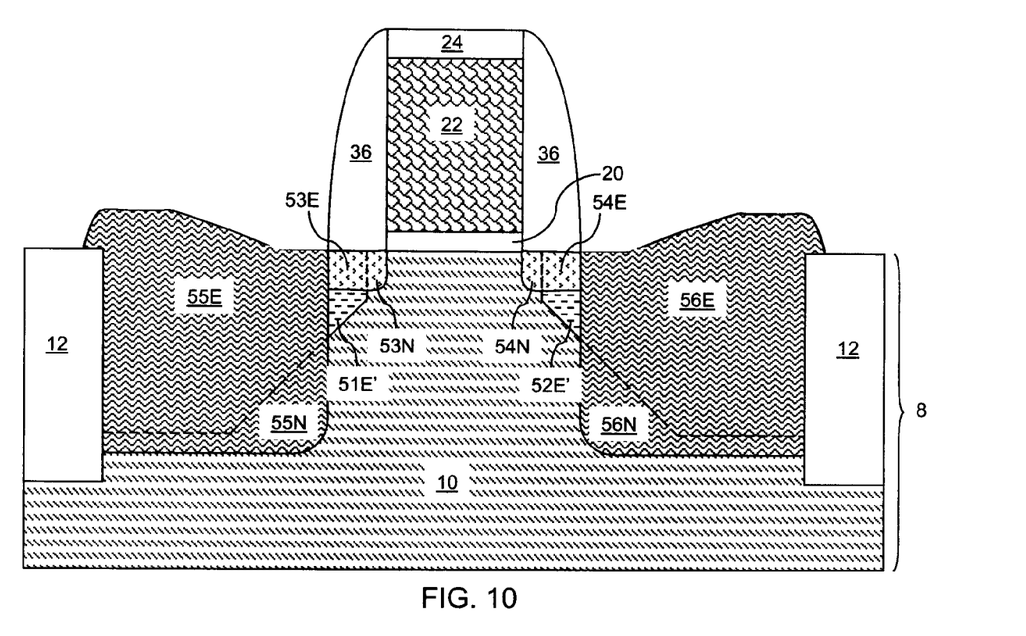
FIG. 10 is a vertical cross-sectional view of the second exemplary semiconductor structure after deep source/drain ion implantation according to the second embodiment of the present invention.

Referring to FIG. 10, deep source/drain ion implantation is performed to implant additional dopants of the second conductivity type employing the combination of the gate stack (20, 22, 24) and the gate spacer 36 as an implantation mask. An additional implantation mask such as a patterned photoresist (not shown) may be employed to block implantation of the dopants of the second conductivity type in areas in which implantation of the dopants is not desired. A deep source region and a deep drain region are formed by implanting the dopants of the second conductivity type into the pair of embedded semiconductor material portions (51E, 52E) and portions of the semiconductor layer 10 employing the gate stack (20, 22, 24) and the gate spacer 36 as an implantation mask.

The deep source region includes a source-side upper portion 55E and a source-side lower portion 55N. The deep drain region includes a drain-side upper portion 56E and a drain-side lower portion 56N. The entirety of the deep source region (55N, 55E) and the deep drain region (56E, 56N) has a doping of the second conductivity type. The source-side upper portion 55E and the drain-side upper portion 56E include the second single-crystalline semiconductor material. The source-side lower portion 55N and the drain-side lower portion 56N include the first single-crystalline semiconductor material.

The implanted portion of the second source-side extension region portion 53E is incorporated into the source-side upper portion 55E having a doping of the second conductivity type. Typically, the dopant concentration of any portions of the deep source region (55N, 55E) is greater than the dopant concentration in the source-side extension region (53N, 53E). The implanted portion of the second drain-side extension region portion 54E is incorporated into the drain-side upper portion 56E having a doping of the second conductivity type. Typically, the dopant concentration of any portions of the deep drain region (56N, 56E) is greater than the dopant concentration in the drain-side extension region (54N, 54E).

The unimplanted portion of the source-side embedded semiconductor material portion 51E constitutes a first source-side semiconductor material portion 51E', which includes the second single-crystal semiconductor material. The source-side embedded semiconductor material portion 51E' vertically contacts the second source-side extension region portion 53E and laterally contacts and the deep source region (55N, 55E). The source-side semiconductor material portion 51E' has a doping of the first conductivity type or undoped.

The unimplanted portion of the drain-side embedded semiconductor material portion 52E constitutes a first drain-side semiconductor material portion 52E', which includes the second single-crystal semiconductor material. The drain-side embedded semiconductor material portion 52E' vertically contacts the second drain-side extension region portion 54E and laterally contacts and the deep drain region (56N, 56E). The drain-side semiconductor material portion 52E' has a doping of the first conductivity type or undoped.

Figure 11:
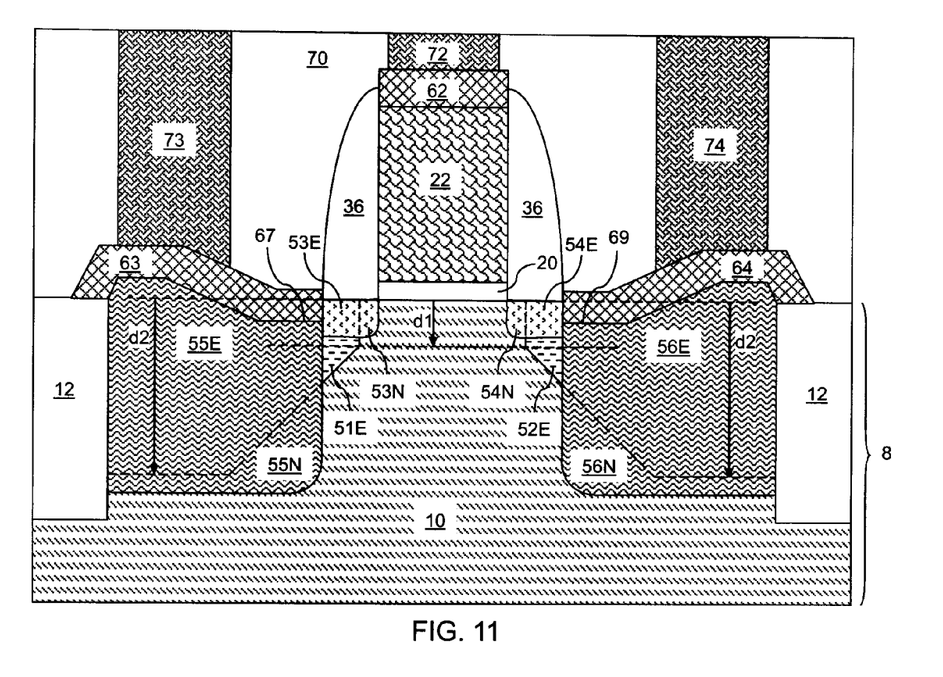
FIG. 11 is a vertical cross-sectional view of the second exemplary semiconductor structure after formation of metal-semiconductor alloy portions and contact structures according to the second embodiment of the present invention.

Referring to FIG. 11, the gate cap dielectric 24 is removed selective to the gate conductor 22. Various metal-semiconductor alloy portions are formed, for example, by reacting a metal layer with exposed semiconductor material portions including exposed surfaces of source-side upper portion 55E, drain-side upper portion 56E, and the top surface of the gate conductor 22. The various metal semiconductor alloy portions can include a source-side metal-semiconductor alloy portion 63 that is located on the deep source region (55E, 55N) and a drain-side metal-semiconductor alloy portion 64 that is located on the deep drain region (56N, 56E). A first interface 67 between a proximal portion of the source-side metal-semiconductor alloy portion 63 and the source-side upper portion 55E is a first planar surface that is located between the top surface of the semiconductor layer 10 and the first depth d1. The proximal portion of the source-side metal-semiconductor alloy portion 63 is the sub-portion of the source-side metal-semiconductor alloy portion 63 that is located in proximity to the gate stack (20, 22). A second interface 69 between a proximal portion of the drain-side metal-semiconductor alloy portion 64 and the drain-side upper portion 56E is a second planar surface that is located between the top surface of the semiconductor layer 10 and the first depth d1. The proximal portion of the drain-side metal-semiconductor alloy portion 64 is the sub-portion of the drain-side metal-semiconductor alloy portion 64 that is located in proximity to the gate stack (20, 22). A gate-side metal semiconductor alloy 62 can be formed on the gate conductor 22.

A middle-of-line (MOL) dielectric layer 70 is subsequently deposited over the various metal semiconductor alloy portions (62, 63, 64). The MOL dielectric layer 70 includes a dielectric material such as doped silicate glass, undoped silicate glass, a low-k CVD material such as organosilicate glass, a spin-on low-k dielectric material, or a combination thereof. A "low-k" material refers to a material having a dielectric constant less than the dielectric constant of silicon oxide, i.e., 3.9. Various contact structures are formed by filling contact via holes in the MOL dielectric layer 70 and subsequently filling the contact via holes with a conductive material such as metal. The various contact structures can include, for example, a source-side contact via 73, a drain-side contact via 74, and a gate-side contact via 72.

The second exemplary semiconductor structure is a field effect transistor in which the deep source region (55E, 55N) is the source of the transistor, and the deep drain region (56E, 56N) is the drain of the transistor. The source-side extension region (53N, 53E) is the source extension of the transistor, and the drain-side extension region (54N, 54E) is the drain extension of the transistor. The second exemplary semiconductor structure provides the benefit of uniaxial stress in the channel while minimizing the punch-through between the source and the drain because of the lateral distance between the deep source region (55E, 55N) and the deep drain region (56E, 56N) is greater than the lateral distance between the closest portions including the second single-crystalline semiconductor material.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A semiconductor structure comprising:
    a gate stack located on a top surface of a semiconductor layer in a semiconductor substrate, said semiconductor layer comprising a first single-crystalline semiconductor material; and
    a pair of embedded semiconductor material portions embedded in said semiconductor layer and comprising a second single-crystalline semiconductor material that is epitaxially aligned with, and lattice mismatched with, said first single-crystalline semiconductor material, wherein each of said pair of embedded semiconductor material portions has a slanted planar interface between a first depth from a top surface of said semiconductor layer into said semiconductor substrate and a second depth from said top surface into said semiconductor substrate, said second depth being greater than said first depth.

2. The semiconductor structure of claim 1, wherein each of said pair of embedded semiconductor material portions has a substantially vertical interface with said semiconductor layer between said top surface and said first depth, and a substantially horizontal interface with said semiconductor layer at said second depth.

3. The semiconductor structure of claim 1, wherein said first single-crystalline semiconductor material is silicon, and said second single-crystalline semiconductor material is a silicon-germanium alloy.

4. The semiconductor structure of claim 1, wherein said first single-crystalline semiconductor material is silicon, and said second single-crystalline semiconductor material is a silicon-carbon alloy.

5. The semiconductor structure of claim 1, wherein said gate stack includes, from bottom to top, a gate dielectric and a gate electrode, said semiconductor structure is a field effect transistor having a channel comprising a portion of said semiconductor layer directly underneath said gate dielectric, said channel having a doping of a first conductivity type, and an entirety of each of said pair of embedded semiconductor material portions has a doping of a second conductivity type that is the opposite of said first conductivity type.

6. The semiconductor structure of claim 5, further comprising:
    a source-side extension region comprising said first single-crystal semiconductor material and having a doping of said second conductivity type and contacting a source-side embedded semiconductor material portion among said pair of embedded semiconductor material portions; and
    a drain-side extension region comprising said first single-crystal semiconductor material and having a doping of said second conductivity type and contacting a drain-side embedded semiconductor material portion among said pair of embedded semiconductor material portions.

7. The semiconductor structure of claim 5, further comprising:
    a source-side metal-semiconductor alloy portion located on a source-side embedded semiconductor material portion among said pair of embedded semiconductor material portions, wherein an interface between a proximal portion of said source-side metal-semiconductor alloy portion and said source-side embedded semiconductor material portion is a first planar surface that is located between said top surface of said semiconductor layer and said first depth; and
    a drain-side metal-semiconductor alloy portion located on a drain-side embedded semiconductor material portion among said pair of embedded semiconductor material portions, wherein an interface between a proximal portion of said drain-side metal-semiconductor alloy portion and said drain-side embedded semiconductor material portion is a second planar surface that is located between said top surface of said semiconductor layer and said first depth.

8. The semiconductor structure of claim 1, wherein said gate stack includes, from bottom to top, a gate dielectric and a gate electrode, said semiconductor structure is a field effect transistor having a channel comprising a portion of said semiconductor layer directly underneath said gate dielectric, said channel having a doping of a first conductivity type, and each of a deep source region and a deep drain region of said field effect transistor includes an upper portion comprising said second single-crystalline semiconductor material and having a doping of a second conductivity type and a lower portion comprising said first single-crystalline semiconductor material and having a doping of said second conductivity type, wherein said second conductivity type is the opposite of said first conductivity type.

9. The semiconductor structure of claim 8, further comprising:
    a first source-side extension region portion comprising said first single-crystal semiconductor material and having a doping of said second conductivity type and contacting one side of said channel;
    a second source-side extension region portion comprising said second single-crystal semiconductor material and having a doping of said second conductivity type and contacting a source-side embedded semiconductor material portion among said pair of embedded semiconductor material portions;
    a first drain-side extension region portion comprising said first single-crystal semiconductor material and having a doping of said second conductivity type and contacting another side of said channel; and
    a second drain-side extension region portion comprising said second single-crystal semiconductor material and having a doping of said second conductivity type and contacting a drain-side embedded semiconductor material portion among said pair of embedded semiconductor material portions.

10. The semiconductor structure of claim 9, further comprising:
   a source-side semiconductor material portion comprising said second single-crystal semiconductor material and contacting said second source-side extension region portion and said deep source region; wherein said source-side semiconductor material portion has a doping of said first conductivity type or undoped; and
   a drain-side semiconductor material portion comprising said second single-crystal semiconductor material and contacting said second drain-side extension region portion and said deep drain region; wherein said drain-side semiconductor material portion has a doping of said first conductivity type or undoped.

11. The semiconductor structure of claim 8, further comprising:
   a source-side metal-semiconductor alloy portion located on said deep source region, wherein an interface between a proximal portion of said source-side metal-semiconductor alloy portion and said deep source region is a first planar surface that is located between said top surface of said semiconductor layer and said first depth; and
   a drain-side metal-semiconductor alloy portion located on said deep drain region, wherein an interface between a proximal portion of said drain-side metal-semiconductor alloy portion and said deep drain region is a second planar surface that is located between said top surface of said semiconductor layer and said first depth.

\* \* \* \* \*